US008020077B1

United States Patent
Gorshe

(10) Patent No.: US 8,020,077 B1
(45) Date of Patent: Sep. 13, 2011

(54) FORWARD ERROR CORRECTION WITH SELF-SYNCHRONOUS SCRAMBLERS

(75) Inventor: Steven Scott Gorshe, Beaverton, OR (US)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 13/019,734

(22) Filed: Feb. 2, 2011

Related U.S. Application Data

(62) Division of application No. 11/753,409, filed on May 24, 2007, now Pat. No. 7,913,151.

(60) Provisional application No. 60/808,793, filed on May 26, 2006.

(51) Int. Cl.
H03M 13/00 (2006.01)
(52) U.S. Cl. .......... 714/777; 714/781; 714/799
(58) Field of Classification Search .......... 714/777, 714/781, 799
See application file for complete search history.

(56) References Cited

U.S. PATENT DOCUMENTS

| | | | |
|---|---|---|---|
| 5,014,274 A | 5/1991 | Higurashi et al. | |
| 5,235,645 A | 8/1993 | Stocker | |
| 5,241,546 A | 8/1993 | Peterson et al. | |
| 5,321,754 A | 6/1994 | Fisher et al. | |
| 5,530,959 A | 6/1996 | Amrany | |
| 5,923,680 A | 7/1999 | Brueckheimer et al. | |
| 6,609,226 B1 | 8/2003 | Figueira | |
| 6,662,332 B1* | 12/2003 | Kimmitt | 714/762 |
| 6,738,935 B1* | 5/2004 | Kimmitt | 714/701 |
| 7,127,653 B1 | 10/2006 | Gorshe | |
| 7,234,097 B1* | 6/2007 | Feng et al. | 714/758 |
| 7,475,331 B1* | 1/2009 | Feng | 714/807 |
| 7,555,052 B2* | 6/2009 | Pons et al. | 375/265 |
| 7,697,685 B1* | 4/2010 | Feng | 380/210 |
| 7,900,128 B1* | 3/2011 | Feng | 714/809 |
| 2003/0217320 A1 | 11/2003 | Gorshe | |

OTHER PUBLICATIONS

American National Standard for Telecommunications—T1.105 (2001)—Synchronous Optical Network (SONET)—Basic Description including Multiplex Structure, Rates, and Formats; 2001; Alliance for Telecommunications Industry Solutions; Washington.
American National Standard for Telecommunications—T1.105.02 (2001)—Synchronous Optical Network (SONET)—Payload Mappings; 2001; Alliance for Telecommunications Industry Solutions; Washington.
ITU-T (Telecommuniaction Standardization Sector of International Telecommunication Union); Recommendation G.7041/Y.1303 (2005) Generic Framing Procedure (GFP); Aug. 2005.
ITU-T (Telecommuniaction Standardization Sector of International Telecommunication Union); Recommendation G.7041/Y.1303 Amendment 1 (2006) Generic Framing Procedure (GFP) Amendment 1, Mar. 2006.

(Continued)

*Primary Examiner* — Esaw T Abraham
(74) *Attorney, Agent, or Firm* — Knobbe Martens Olson & Bear LLP

(57) ABSTRACT

Systems and methods correct multiplied errors generated by feedback taps in self-synchronous descramblers. The multiplication of errors degrades the performance of most linear cyclic error check codes. Disclosed techniques are general applicable to multiplied errors even when those errors are not confined to a single block. Disclosed techniques permit a reduction in the amount of forward error correction used. For example, in general, to correct t errors, a linear cyclic error correction code requires a Hamming distance of at least $1+(2t)[wt(s(x))]$. Embodiments of the invention allow correcting the multiplied errors with a Hamming distance of only $1+(t)(1+wt(s(x)))$ over the block size n, wherein $wt(s(x))$ is the weight of the scrambler polynomial $s(x)$.

9 Claims, 14 Drawing Sheets

OTHER PUBLICATIONS

ITU-T (Telecommuniaction Standardization Sector of International Telecommunication Union); Recommendation G.7041/Y.1303 Amendment 2 (2007) Generic Framing Procedure (GFP) Amendment 2, Jul. 2007.

ITU-T (Telecommuniaction Standardization Sector of International Telecommunication Union); Recommendation G.7041/Y.1303 Corrigendum 1 (2006) Generic Framing Procedure (GFP) Corrigendum 1; Dec. 2006.

S. Gorshe, "CRC-16 Polynomials Optimized for Applications Using Self-Synchronous Scramblers," Proc. of IEEE ICC2002, pp. 2791-2795.

* cited by examiner

FORWARD ERROR CORRECTION WITH SELF-SYNCHRONOUS SCRAMBLERS

CROSS-REFERENCE TO RELATED APPLICATIONS

This application is a divisional application of U.S. patent application Ser. No. 11/753,409, filed May 24, 2007, issued on Mar. 22, 2011 as U.S. Pat. No. 7,913,151, which claims the benefit under 35 U.S.C. §119(e) of U.S. Provisional Application No. 60/808,793, filed May 26, 2006, the disclosures of each of which are hereby incorporated by reference in their entireties herein.

This application is related to application Ser. No. 10/147,880, filed on May 20, 2002, which is abandoned; copending application Ser. No. 11/167,109, filed on Jun. 28, 2005 and issued as U.S. Pat. No. 7,426,679 on Sep. 16, 2008, which is a divisional application of application Ser. No. 10/147,880; and copending application Ser. No. 11/167,122, filed on Jun. 28, 2005, filed on Jun. 28, 2005 and issued as U.S. Pat. No. 7,353,446 on Apr. 1, 2008, which is a continuation application of application Ser. No. 10/147,880, the disclosures of which are hereby incorporated by reference herein.

BACKGROUND OF THE INVENTION

1. Field of the Invention

The invention relates to telecommunications and data communications, and in particular, to systems in which data is carried over a transmission link that uses self-synchronous scramblers.

2. Description of the Related Art

Examples of such transmission links include synchronous optical networking (SONET), Syncrhonous SDH, and OTN optical transmission systems using Packet over SONET/SDH (PoS), Generic Framing Procedure (GFP) or Asynchronous Transfer Mode (ATM) for data encapsulation. These links use self-synchronous data scramblers to prevent the potential harm that data from one subscriber could cause to data from other subscribers. The drawback to self-synchronous scramblers is that the descrambling process multiplies errors that occur in the transmission channel, which in turn can decrease the effectiveness of a linear cyclic error correction code (e.g., Cyclic Redundancy Check (CRC), BCH or Reed-Solomon) over the payload data.

The optical transmission equipment that forms the backbone of the public telecommunications network (i.e., SONET/SDH) uses a non return to zero (NRZ) line code. The critical advantage of the NRZ line code is that it makes the most efficient use of the channel bandwidth of any baseband line code, and is simple to implement. The main drawback to NRZ is that when there is no transition between the values of the bits in the transmitted data, there is no change in the level of the transmitted signal. The receiver relies on these transitions to synchronize its clock/data recovery circuit for determining the boundaries of the individual bits. During a long period with no line code transitions, the relative clock differences between the transmitter and receiver can cause the receiver to miss-sample the incoming data stream. A solution typically used in SONET/SDH is to scramble the data with a frame-synchronized scrambler, see, for example, ANSI/ATIS standard T1.105.02 Synchronous Optical Network (SONET)—Payload Mappings, clause 6. A frame-synchronized scrambler 101, as illustrated in FIG. 1A, is one in which the transmitted data is exclusive-ORed bit-by-bit with the output of a pseudo-random sequence generator, with the sequence generator being reset to a known state at the beginning of every frame. The frame-synchronized scramblers are very effective in increasing the transition density to an acceptable level for typical traffic. One drawback of a frame-synchronized scrambler is that it is a known, relatively short ($2^7-1$) pseudo-random sequence, and it is possible for a malicious subscriber to attempt to mimic this pattern within the data the malicious subscriber sends. The result is that if the subscriber data lines up with the SONET/SDH scrambler correctly, a long string can occur with no transitions, which in turn can cause the receiver to fail. This phenomenon was observed with early ATM and POS systems and was addressed from the outset with GFP. The solution used for each of these three protocols is a self-synchronous scrambler over the payload region of the cell/packet.

A self-synchronous scrambler 102, as illustrated in FIG. 1B, is one in which the data is exclusive-ORed with a delayed version of itself on a bit-by-bit basis, which is effectively a GF[2] division process. The specific scrambler used for ATM, POS, and GFP exclusive-ORs the input data with scrambler output data after a 43-bit delay, see, for example, U.S. Pat. No. 6,609,226 to Figueira. In other words, they use an $x^{43}+1$ scrambler polynomial. The descrambler 103 reverses the process by multiplying the received signal by the same scrambler polynomial. The advantage to such a scrambler in this application is that it is relatively hard for a malicious user to duplicate due to its length and not having a known reset point. The value of the scrambler state is function of the previous data rather than the position of the data within the SONET/SDH frame. A drawback to a self-synchronous scrambler 102 is that errors occurring on the transmission channel will be duplicated 43 bits later by the descrambler 103. As a result, an error detection/correction code over the data will have to deal with twice the number of bit errors as that experienced by the transmission channel.

SUMMARY OF THE INVENTION

One embodiment of the invention includes a method for handling the error patterns that can result on data transmission links that utilize self-synchronous scramblers. Self-synchronous descramblers multiply the transmission channel errors according to the polynomial representing the scrambler. A transmission channel error burst will be replicated for each term of the scrambler polynomial such that the resulting error pattern contains multiple copies of the original error burst separated by a number of bits in the data. When the original error burst and all its replications are confined to a single data block, it is possible to exploit knowledge of the scrambler polynomial for error correction within that data block. This allows using a less powerful error correction code than would otherwise be required to correct the number of errors coming from the descrambler.

When the errors in the pattern output from the descrambler cross the boundaries between data blocks, knowledge of the scrambler polynomial can no longer be directly exploited. One embodiment of the invention includes a method for correcting these error patterns by processing the affected data blocks as a block pair. The data block of the pair that contains the fewest errors is first identified. The locations of the errors in this block are subsequently identified. Knowledge of the scrambler polynomial is then exploited to cancel replications of these errors in the other data block of the block pair. Finally, the remaining errors in both data blocks are corrected. This method allows using the same less powerful error correcting code as used when the errors are confined to a single data block. Without this compensation, the error correcting code would need to be able to correct an arbitrary number of errors up to one less than the number of errors in the output burst from the descrambler. One embodiment of the invention includes additional techniques to improve the performance of the basic method, as will be described later.

BRIEF DESCRIPTION OF THE DRAWINGS

These drawings and the associated description herein are provided to illustrate specific embodiments of the invention and are not intended to be limiting.

DETAILED DESCRIPTION OF THE SPECIFIC EMBODIMENTS

Figure 1A:
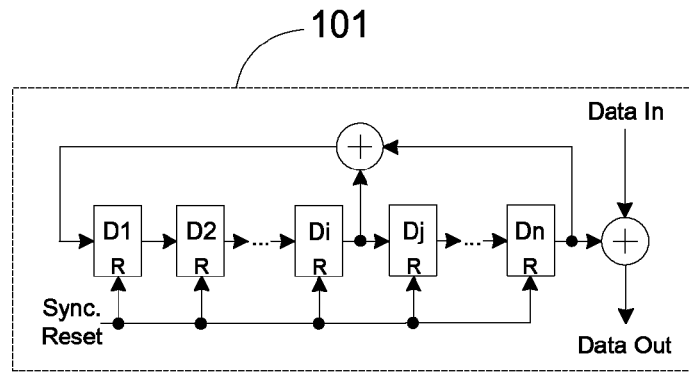
FIG. 1A illustrates a conventional frame-synchronized scrambler.
Figure 1B:
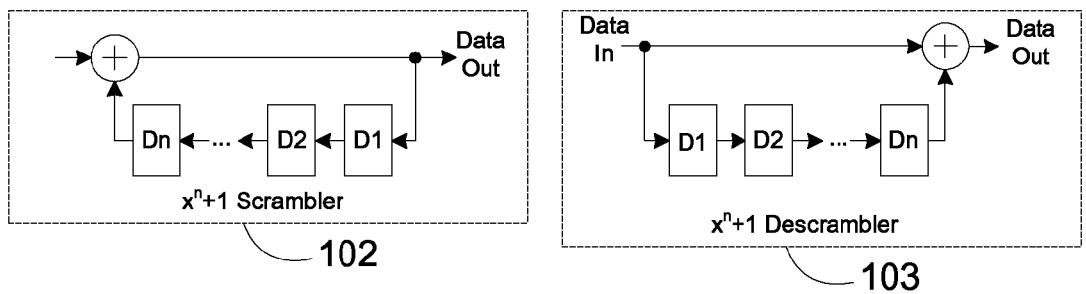
FIG. 1B illustrates a conventional self-synchronous scrambler and a conventional self-synchronous descrambler.

Conventional techniques do not directly take descrambler error multiplication into account. Conventional techniques use of a more powerful Forward Error Correction (FEC) code that is capable of correcting any general error pattern with the number of bit errors that can result from the error multiplication of the smaller pattern. For example, if a maximum of t errors is expected in a block, and the descrambling results in 2t errors, the conventional technique would be to use a FEC code capable of correcting any 2t errors. The use of the more powerful FEC is inefficient for bits transmitted (reduces payload bandwidth) and can be complicated to decode. Embodiments of the invention include a technique for correcting these multiplied errors with a less powerful FEC code.

Pending U.S. Patent Application Publication Nos. 2003/0217320 A1, 2005/0257113 A1, and 2005/0257114 A1 take self-synchronous descrambler error multiplication into account for the special case of a single transmission channel error. Embodiments of the invention address the more complicated general case wherein error bursts with multiple errors can occur in the transmission channel.

The techniques described in connection with FIGS. 7-11 and 13 can be implemented by hardware, by software, or by a combination of both hardware and software. For example, the disclosed techiques can be embodied in one or more of application specific integrated circuits (ASICs), field-programmable gate arrays (FPGAs), programmable logic devices (PLDs), or the like.

The abbreviations and conventions used in this description are as follows:

n=the number of bits in the code word;
k=the number of data bits in the code word;
y=the number of check symbol bits in the error correction code (n=k+y);
g(x) is the linear cyclic code generator polynomial;
s(x) is the self-synchronous scrambler polynomial;
u=the degree of the scrambler polynomial s(x);
m(x) is the k-bit data block to which the error correcting code is applied;
n(x) is the transmitted code word (data block);
r(x) is the received code word;
r'(x) is the received code after descrambling;
e(x) is the error pattern from the transmission channel expressed in polynomial form;
wt(*) is the Hamming weight of polynomial *;
t=the number of errors; and
x=the number of bits of encapsulation protocol that may be inserted between the data blocks during transmission over the channel.

THEORETICAL BACKGROUND

A linear cyclic error code is formed by treating the data block to be covered as a polynomial. The Cyclic Redundancy Check (CRC), for example, treats the message as a polynomial of the form $m(x)=a_{k-1}x^{k-1}+a_{k-2}x^{k-2}+ \ldots +a_1x+a_0$, wherein m(x) is a k-bit long message block and $a_i$ is the data value at the $i^{th}$ data position ($a_{k-1}$=MSB). For systematic codes such as the CRC-y code, m(x) is divided by the generator polynomial g(x) and the remainder of that division is appended to the end of m(x) as the check symbol value such that dividing any such resulting n=k+y bit block by g(x) will result in a remainder that has the same constant value regardless of the original value of m(x). It should be noted that there are some variations among different CRC techniques regarding exactly how the remainder is formatted to create the CRC. For example, in a typical CRC-16 application, the division by g(x) is performed on $x^{16}m(x)$, i.e., m(x) shifted left by 16 places with zero fill. The remainder is then appended to the LSB end of the m(x) as the CRC code. As a result, the resulting n-bit data pattern is always divisible by g(x) and gives a constant remainder of 0. Other linear cyclic codes are similar in that each code word is divisible by the generator polynomial to yield a predetermined remainder value.

At the receiver, the original data is regarded as error-free if the division of the received data block (m(x) and the CRC) yields this constant remainder, since transmission bit errors effectively change the $a_i$ values of the transmitted polynomial. Errors are undetectable whenever the received data block has been changed into another valid code word, i.e., into a polynomial that will give the desired constant remainder when divided by g(x).

The transmission errors occurring during the transmission of a data block can be represented by the polynomial e(x). If the transmitted data block is represented by n(x), then the received data block $r(x)=n(x)+e(x)$. As noted above, error pattern $e(x)$ is only undetectable when $r(x)/g(x)$ leads to the desired constant value. Without loss of generality, the subsequent analysis of this disclosure assumes that the linear cyclic code is implemented as typical for CRC-16s in which the remainder of $n(x)/g(x)=0$. Then, the remainder of $r(x)/g(x)$ is the remainder of $[n(x)/g(x)+e(x)/g(x)]$, which implies that an error pattern is only undetectable if the remainder of $e(x)/g(x)=0$. In mathematical representation, the remainder of $a(x)/b(x)$ can be written as $a(x)$ mod $b(x)$.

Since the descrambling process for a self-synchronous scrambler effectively multiplies the received data polynomial $r(x)$ by the scrambler polynomial $s(x)$, if $r'(x)$ corresponds to the descrambled data block, then:

$$r'(x)=r(x)s(x).$$

Since $r(x)=n(x)+e(x)$, then:

$$r'(x) = s(x)[n(x) + e(x)] = s(x)n(x) + s(x)e(x)$$

$$r'(x) \bmod g(x) = [s(x)n(x) + s(x)e(x)] \bmod g(x)$$

$$= 0 + [s(x)e(x)] \bmod g(x).$$

Consider a case wherein $s(x)$ and $g(x)$ have a common factor, $f(x)$ of degree $z$. Then, letting $a(x)=s(x)/f(x)$ and $b(x)=g(x)/f(x)$, we have $[s(x)e(x)]$ mod $g(x)=[a(x)e(x)]$ mod $b(x)$. This common factor effectively reduces the degree of the CRC by $z$, giving a performance equivalent to a CRC-$(y-z)$ polynomial. On the average, the probability of undetectable errors for a CRC-y code is $1/2^y$ for error magnitudes beyond what it is guaranteed detectable. The common $s(x)$, $g(x)$ factor therefore increases the undetectable error probability by a factor of $2^z$, if the transmission errors and the multiplied errors are all contained within $r'(x)$.

While illustrated in the context of self-synchronous scrambler polynomials of the form $s(x)=x^u+1$, which is the most common form of scrambler polynomial, the skilled artisan will appreciate that the principles and advantages described herein are applicable to other types of scrambler polynomials. For example, the self-synchronous scrambler polynomial can have additional terms, e.g., $s(x)=x^a+x^b+1$, which generate additional errors via replication within the scrambler, which can then be cancelled by disclosed techniques.

Figure 2A:
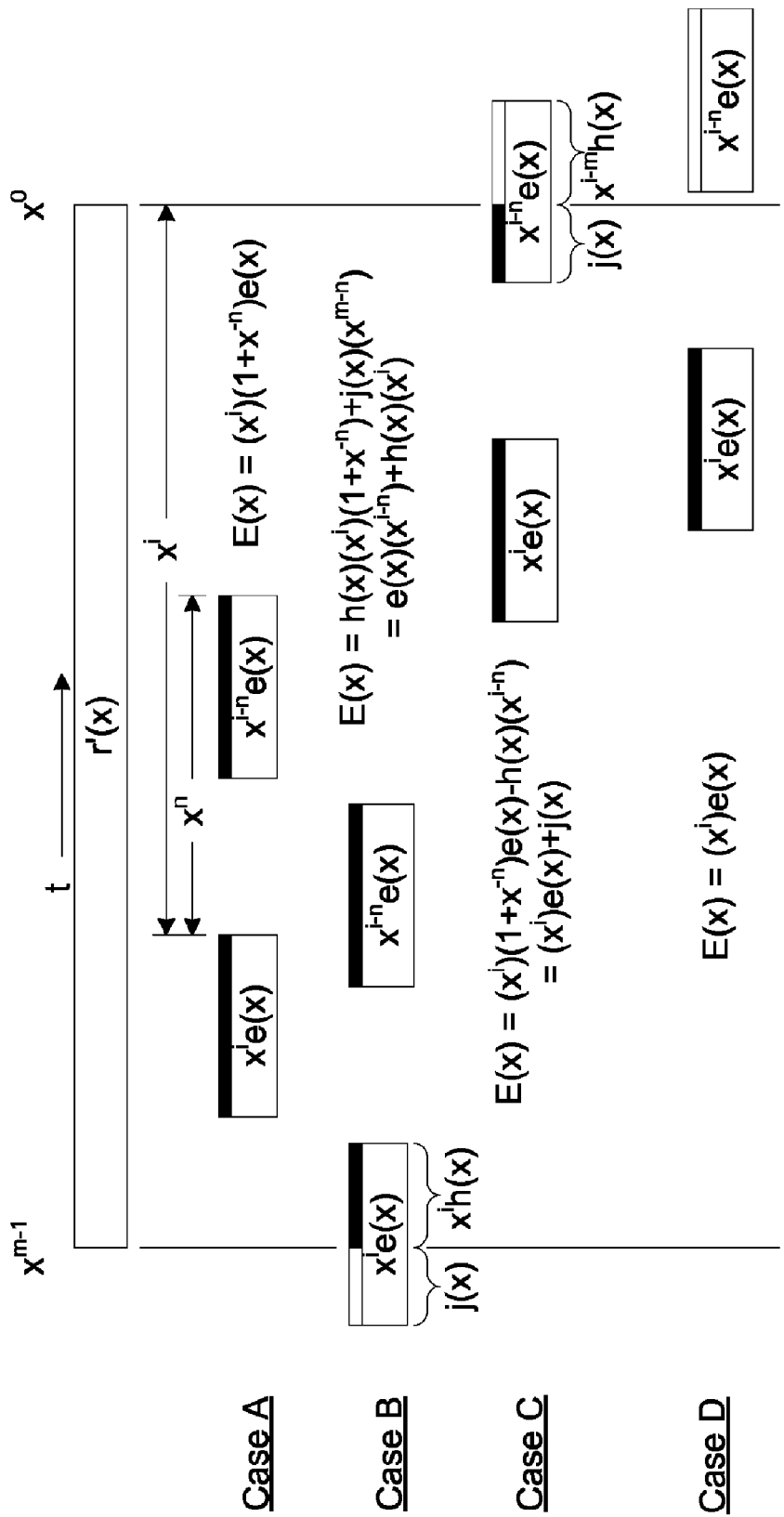
FIGS. 2A and 2B illustrate variations (A to I) of potential error pattern alignments.
Figure 2B:
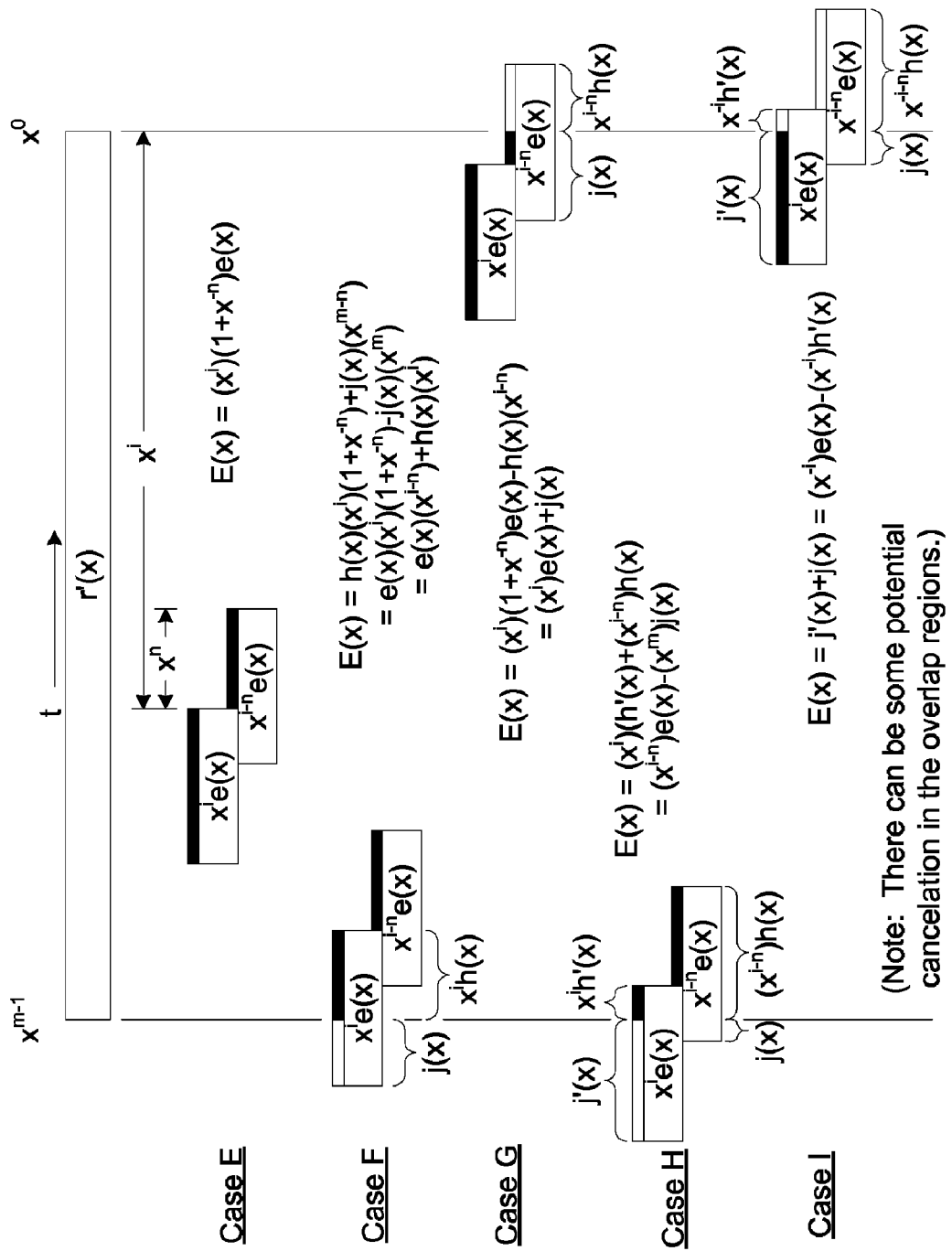

FIGS. 2A and 2B illustrate nine potential error pattern alignments relative to the boundaries of a data block protected by the error correcting code. The error patterns here are the original error burst and its replication due to the descrambler multiplication. In Cases A to D, there is no overlap between the bits affected by the original error burst and the bits affected by the error multiplication. With Cases E to I, overlap exists between the original and replicated error patterns. For Cases A and E, all the error bits are contained within a single data block. For Cases B and F, the affected bits of the original error burst affect two blocks, but the replicated errors are confined to a single block. For Cases C and G, the original error burst is confined to a single block while the affected bits of the replicated errors affect two blocks. For Case D, the original error burst and its replication are each respectively entirely confined to different data blocks. For Cases H and I, both the original and replicated error patterns affect two blocks.

Single Error Correction

It can be desirable to provide error correction for data that traverses a link with a self-synchronous scrambler. The different error multiplication scenarios are illustrated in FIGS. 2A and 2B. Consider first the case of single error correction, which can often be accomplished with the CRC. This case falls within the scenarios of FIG. 2A. A y-bit linear cyclic code is capable of single error correction for blocks of up to $2^Y-1$ bits as long as it maintains a $d_{min} \geq 3$ over this range. In general, in order to perform error correction a code must produce unique syndromes for each error pattern. A syndrome for a linear cyclic code is the remainder produced by the division of the received block by the generator polynomial, which is $[r'(x)]$ mod $g(x)$ here.

Theorem 1—Single error correction is possible with a linear cyclic code generator polynomial $g(x)$ and a scrambler polynomial of the form $s(x)=x^u+1$ as long as $\gcd(g(x), s(x))=1$ and $d_{min} \geq 4$ over the block size n.

Proof Single error detection is possible if each of the following criteria is met, which are the mathematical statements for the required uniqueness for each syndrome:

1. $x^i$ mod $g(x) \neq x^j$ mod $g(x)$ for all $i \neq j \leq n$;
2. $[(x^i)(x^u+1)]$ mod $g(x) \neq [(x^j)(x^u+1)]$ mod $g(x)$ for all $i \neq j \leq n$; and
3. $x^i$ mod $g(x) \neq [(x^j)(x^u+1)]$ mod $g(x)$ for all i and $j \leq n$.

Assume an equality for each criterion, and then determine the criteria under which a contradiction occurs.

$$(x^i+x^j) \bmod g(x)=0;$$

$$[(x^i)(1+x^l)] \bmod g(x)=0 \text{ for } j=i+l. \quad \text{Criterion 1}$$

But, since $\gcd(x^i, g(x))=1$ and $\gcd(1+x^l, g(x))=1$ due to $g(x)$ providing $d_{min} \geq 4$, criterion 1 is met.

$$[(x^u+1)(x^i+x^j)] \bmod g(x)=0;$$

$$[(x^u+1)(x^i)(1+x^l)] \bmod g(x)=0 \text{ for } j=i+l \quad \text{Criterion 2}$$

But, since $\gcd(x^i, g(x))=1$ and $\gcd(1+x^l, g(x))=1$ due to $g(x)$ providing $d_{min} \geq 4$, criterion 2 is also met.

$$[x^i+(x^j)(1+x^u)] \bmod g(x)=0$$

which gives:

$$[(x^j)(1+x^l+x^u)] \bmod g(x)=0 \text{ for } i=j+l \text{ and}$$

$$[(x^i)(1+x^l+x^u)] \bmod g(x)=0 \text{ for } j=i+l \quad \text{Criterion 3}$$

Again, $\gcd(x^i, g(x))=1$. Since $1+x^l+x^u$ and $1+x^l+x^{l+u}$ have a weight of three, we are guaranteed that $\gcd(1+x^l+x^u, g(x))=1$ and $\gcd(1+x^l+x^{1+u}, g(x))=1$ for our assumed $d_{min} \geq 4$. QED.

An example application of Theorem 1 is the error detection/correction in the Transparent Generic Framing Procedure (GFP-T), see ITU-T Recommendation G.7041/Y.1303 (2005) Generic Framing Procedure (GFP). Theorem 1 applications are further discussed in S. Gorshe, "CRC-16 Polynomials Optimized for Applications Using Self-Synchronous Scramblers," Proc. of IEEE ICC2002, pp. 2791-2795.

The proof of Theorem 1 is for the strong case in which all possible single errors and all possible descrambled errors within the block have unique polynomials. A weaker case is also possible as long the data is always guaranteed to pass through a scrambler/descrambler. In this case the only single errors of concern will occur within k bits of the boundaries of the n bit block, thus reducing the total number of potential syndromes and potentially allowing a weaker code to still correct the errors.

Error Correction when all Errors are Confined to a Single Block

The case wherein the original and multiplied errors are confined to a single block (i.e., Case A in FIG. 2A) will now be discussed. The error pattern addressed by Theorem 1 is the trivial version of Case A, since Cases B and C would leave a single error in each block. For Case A, Theorem 1 and its proof can be further generalized as follows:

Theorem 2—If the original and multiplied error patterns are confined to a single data block, it is possible to correct t errors with a generator polynomial g(x) and a scrambler s(x) as long as gcd(g(x), s(x))=1 and $d_{min} \geq 1+(t)(1+wt(s(x)))$ over the block size n, where t is the maximum allowable number of errors in the channel for a given specification per block prior to descrambling and wt(s(x)) is the weight of the polynomial s(x).

Proof: In general, a $d_{min} \geq 2t+1$ is required for the correction of t errors. For any arbitrary error patterns e(x) or e'(x) with weight ≦t, which are detectable if no scrambler is present, the error detection criteria for this case become:

1. $[(x^i)(e(x))] \bmod g(x) \neq [(x^j)(ex))] \bmod g(x)$ for all i≠j,
2. $[(x^i)(e(x))(s(x))] \bmod g(x) \neq [(x^j)(e(x))(s(x))] \bmod g(x)$ for all i≠j,
3. $[(x^i)(e(x))] \bmod g(x) \neq [(x^j)(e'(x))(s(x))] \bmod g(x)$ for all i, j, e(x), and e'(x)

$$[(x^i+x^j)(e(x))] \bmod g(x)=0$$

$$[(x^i)(1+x^l)(e(x))] \bmod g(x)=0 \text{ for } j=i+l. \quad \text{Criterion 1}$$

But, since gcd($x^i$, g(x))=1, gcd($1+x^l$, g(x))=1, and gcd(e(x), g(x))=1 due to g(x) providing the $d_{min} \geq 2t+1$, criterion 1 is met. (This is the criterion for correcting e(x) if no scrambler was present.)

$$[(s(x))(e(x))(x^i+x^j)] \bmod g(x)=0$$

$$[(s(x))(e(x))(x^i)(1+x^l)] \bmod g(x)=0 \text{ for } j=i+l \quad \text{Criterion 2}$$

Again, gcd($x^i$, g(x))=1 and gcd($1+x^l$, g(x))=1, and gcd(e(x), g(x))=1 due to choice of g(x). It's not necessarily true that gcd(e(x), g(x))=1, however as long as the gcd of the other factors with g(x) is 1, it is sufficient that e(x) mod g(x)≠0, and so criterion 2 is also met.

$$[(x^i)(e(x))+(x^j)(e'(x))(s(x))] \bmod g(x)=0 \text{ for all } i, j, e x),$$
$$\text{and } e'(x) \quad \text{Criterion 3}$$

The worst case weight of $(x^i)(e(x))+(x^j)(e'(x))(s(x))$ is t+(t)(wt(s(x))), so the criterion is met as long as $d_{min} \geq 1+(t)(1+wt(s(x)))$. QED The worst case number of errors seen in the block is $(wt_{max}(e(x)))(wt(s(x)))=(t)(wt(s(x)))$. In general, to correct this many errors would require $d_{min} \geq (2)(t)[wt(s(x))]+1$. But, (2)(t)[wt(s(x))]+1>1+(t)(1+wt(s(x))), since wt(s(x))≧2. Hence, as either t or wt(s(x)) grow, the $d_{min}$ savings become increasingly substantial for a code to correct t' errors produced by descrambling relative to a code that should correct t' errors in general.

It should be noted that for shortened codes, Theorems 1 and 2, the $d_{min}$ requirement for criterion 3 is an upper bound. With the shortened code, it is possible that there may exist unique syndromes that allow error correction with smaller $d_{min}$ values. The only way to determine whether the error correction is still possible with the smaller $d_{min}$ is to perform an exhaustive evaluation. One method is to calculate the syndromes for each possible error case that we desire to correct, and compare them for uniqueness. Alternatively, using criterion 3 directly, it is sufficient to determine whether $[x^i+(x^j)(s(x))]$ mod g(x)=0 for all i and j in the range of interest. If, for comparison, we assume a serial shift division, both alternatives are $O(n^2)$.

Error Correction when the Error Patterns Cross Block Boundaries

Now that Case A of FIG. 2A has been analyzed, handling of the error patterns represented by Cases B to I in FIGS. 2A and 2B will be described. These cases are relatively important, since it is typically difficult to constrain the multiplied error burst to a single block. Consider first the patterns of Cases B and C. When any of the errors is outside the current block, the error pattern within the current block is no longer e(x)s(x), and hence Theorem 2 no longer directly applies. In the worst case, only a single error from the pattern is located in the adjacent block. Here, the weight of the error pattern in the current block is [(wt(s(x))][wt(e(x))]−1. For wt(s(x))=2 and t errors, we would then require $d_{min}$=(2)(2t−1)−1=4t−3, which is greater than the $d_{min}$=1+(t)(1+wt(s(x)))=3t+1 required by Theorem 2 when t>2. A technique for correcting the multiplied error patterns that cross block boundaries will now be described.

Figure 3:
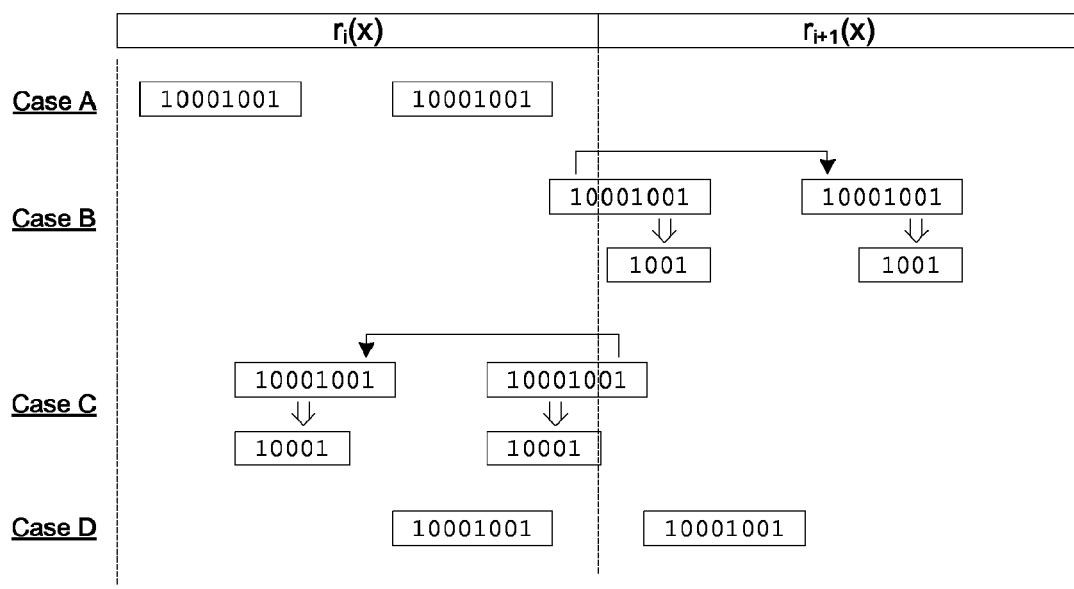
FIG. 3 shows specific examples of Cases A-D.

In order to correct the error patterns that cross block boundaries, disclosed techniques take advantage of knowing that the error pattern is a multiplied error pattern, with the scrambler polynomial s(x) being the multiplier. The analysis presented here assumes, without loss of generality, a scrambler polynomial of the form $s(x)=x^u+1$, which is the most common type. The examples illustrated in FIG. 3 for Cases B and C will now be considered. For Case B, when an error is detected and corrected in block $r_i$, we know that there is an error u bits forward in block $r_{i+1}$ that can be removed (canceled). The resulting error pattern remaining in block $r_{i+1}$ has the form e'(x)s(x), where e'(x) now has a weight one less than the original e(x). At this point, Theorem 2 applies directly to block $r_{i+1}$, and if e(x) could be corrected, so can e'(x), since it has a lower weight than e(x). Similarly, for Case C in FIG. 3 the error corrected in block $r_{i+1}$ allows us to cancel an error u bits back in block $r_i$. Again, Theorem 2 applies to block $r_i$ and the errors can be corrected.

A technique for correcting errors that cross block boundaries is summarized below:
1. Examine blocks in pairs. If an adjacent pair of blocks both contain errors, correct the errors in the block indicating the fewest errors.
2. Next cancel any errors that are forward/back by u bits into the adjacent errored block.
3. Correct the remaining errors in the adjacent block.

This technique assumes that the block with the fewest errors is correctly identified. If only one block indicates a correctable syndrome, it should be used as the starting block. If both blocks indicate correctable syndromes, an additional check can be used to select the correct starting block. If the adjacent block contained a correctable syndrome before the cancellation, but not after, then the process is started over again on the original two received blocks, i.e., back out the error correction done during the first pass. This time, the other block is used as the starting block for error correction.

Figure 4:
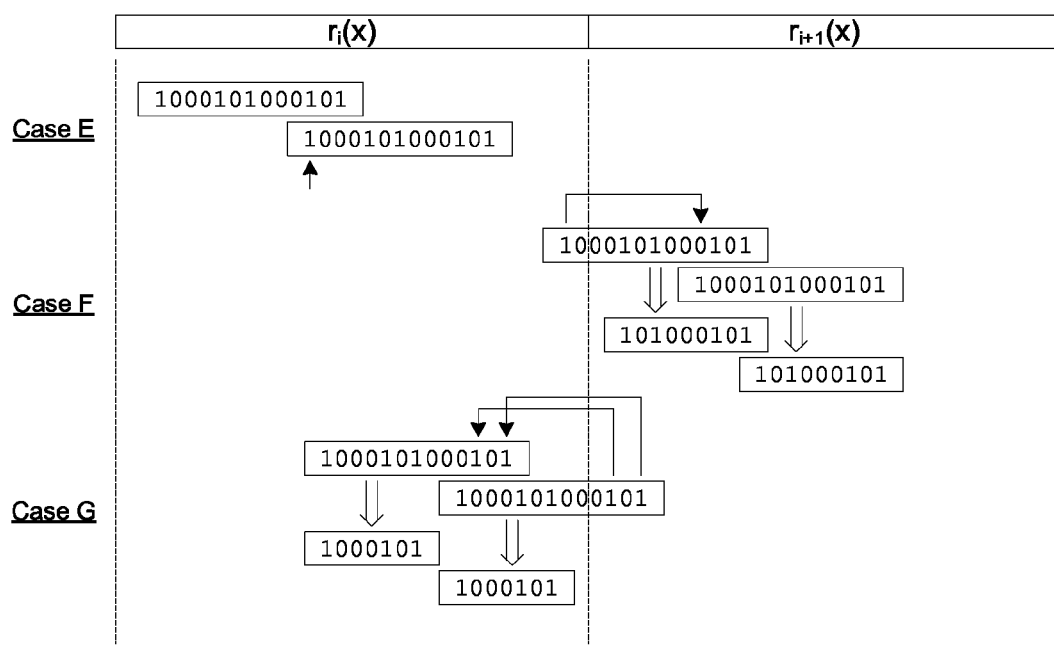
FIG. 4 shows specific examples of Cases E-G.

This technique will handle the cases wherein there is no overlap between the original and multiplied errors. FIG. 4 illustrates some basic examples of cases wherein the original and multiplied errors do overlap (Cases E-G).

For Case E, the overlap either leads to no cancellation (in which case it is indistinguishable from Case A) or cancellation as illustrated in FIG. 4. Even with the cancellation, the resulting error polynomial is still e(x)s(x), and hence Theorem 2 directly applies. Cases F and G are directly analogous to Cases B and C, and the same technique used for Cases B and C can be used for Cases F and G. After the errors are corrected in the block with the fewest errors, that correction is reflected into the adjacent block wherein, from Theorem 2, that block's errors can be corrected.

Figure 5:
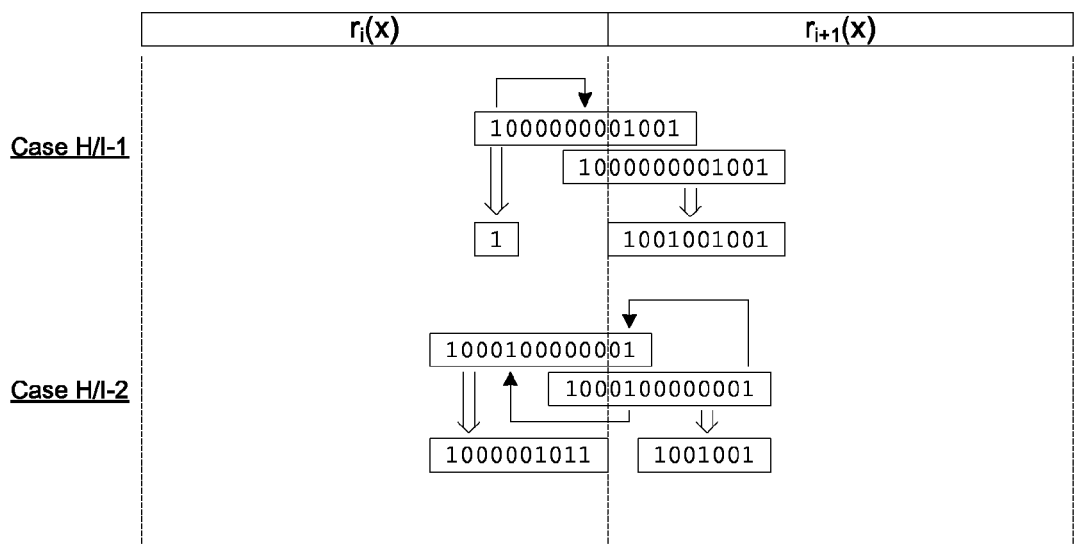
FIG. 5 shows specific individual examples of Cases H and I.
Figure 6:
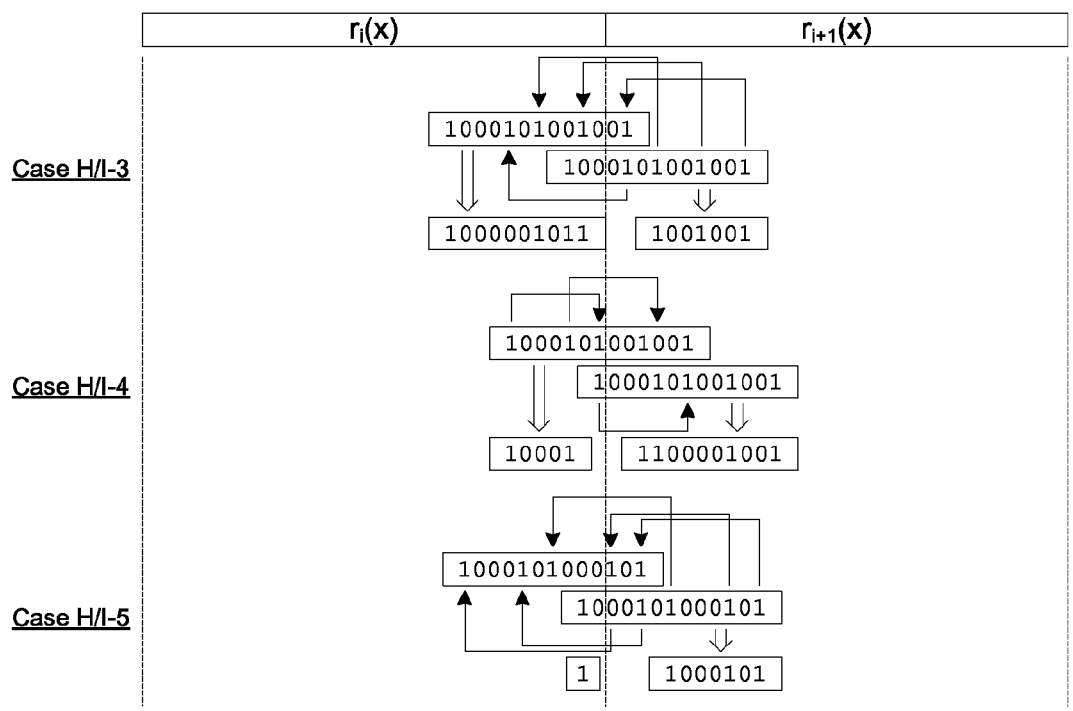
FIG. 6 shows more complex examples of Cases H and I that are composite of other cases.

The more complicated cases of FIGS. 5 and 6 will now be considered. Due to the overlap, there are two additional possibilities. Consider first Case H/I-1 (FIG. 5). Here, the first error on the left in block $r_i$ (part of the original error pattern)

is more than u bits away from the block boundary. As a result, the cancellation actually needs to be done in block $r_i$ rather than adjacent block $r_{i+1}$. Since this error is cancelled in block $r_i$, i.e., it's part of the multiplied error pattern, there is no error n bits forward into block $r_{i+1}$ corresponding to this block $r_i$ error.

Next consider Case H/I-2 (FIG. 5). Here the rightmost error in block $r_{i+1}$ is part of the multiplied error pattern and is more than u bits away from the boundary with the adjacent block. In this case, however, the original and multiplied error patterns overlap such that an original and multiplied error bit already cancel each other out u bits away from the rightmost block $r_{i+1}$ error. Hence the "cancellation" from the rightmost error would actually create a new error bit in block $r_{i+1}$. Further, seeing that there is no error in this expected cancellation position indicates that an overlap cancellation has occurred, and hence there is an error u bits back into block $r_i$ that can be cancelled (as indicated by the lower arrow). As a result, rather than creating a new error in block $r_{i+1}$, the rightmost error in block $r_{i+1}$ should cause a cancellation 2u bits back into block $r_i$. Cases H/I-3-H/I-5 in FIG. 6 illustrate error patterns in which all three scenarios are present.

If a maximum of t errors are expected to be present in a data block, a t-error correcting code can be used. When a self-synchronous descrambler with v taps is used, a total of vt errors can result at the receiver. For example, a typical self-synchronous scrambler uses two taps, e.g., $x^{43}+1$, and hence creates up to 2t errors. it should be noted that the number of taps is also referred to as the "weight" of the scrambler polynomial. Embodiments of the invention also include a technique for correcting the vt errors that can be present after the descrambler using a less powerful error correcting code that is otherwise capable of correcting only <vt errors. This technique works regardless of whether the errors are confined to a single data block, or are spread across adjacent data blocks. Correcting across multiple data blocks is especially challenging for the less powerful codes. For example, one embodiment of the invention allows using a code with Hamming distance $d_{min} \geq 1+(t)[1+wt(s(x))]$ rather than the $d_{min} \geq 1+(2t)[wt(s(x))]$ that would otherwise be required.

Illustrative Embodiment

Figure 7:
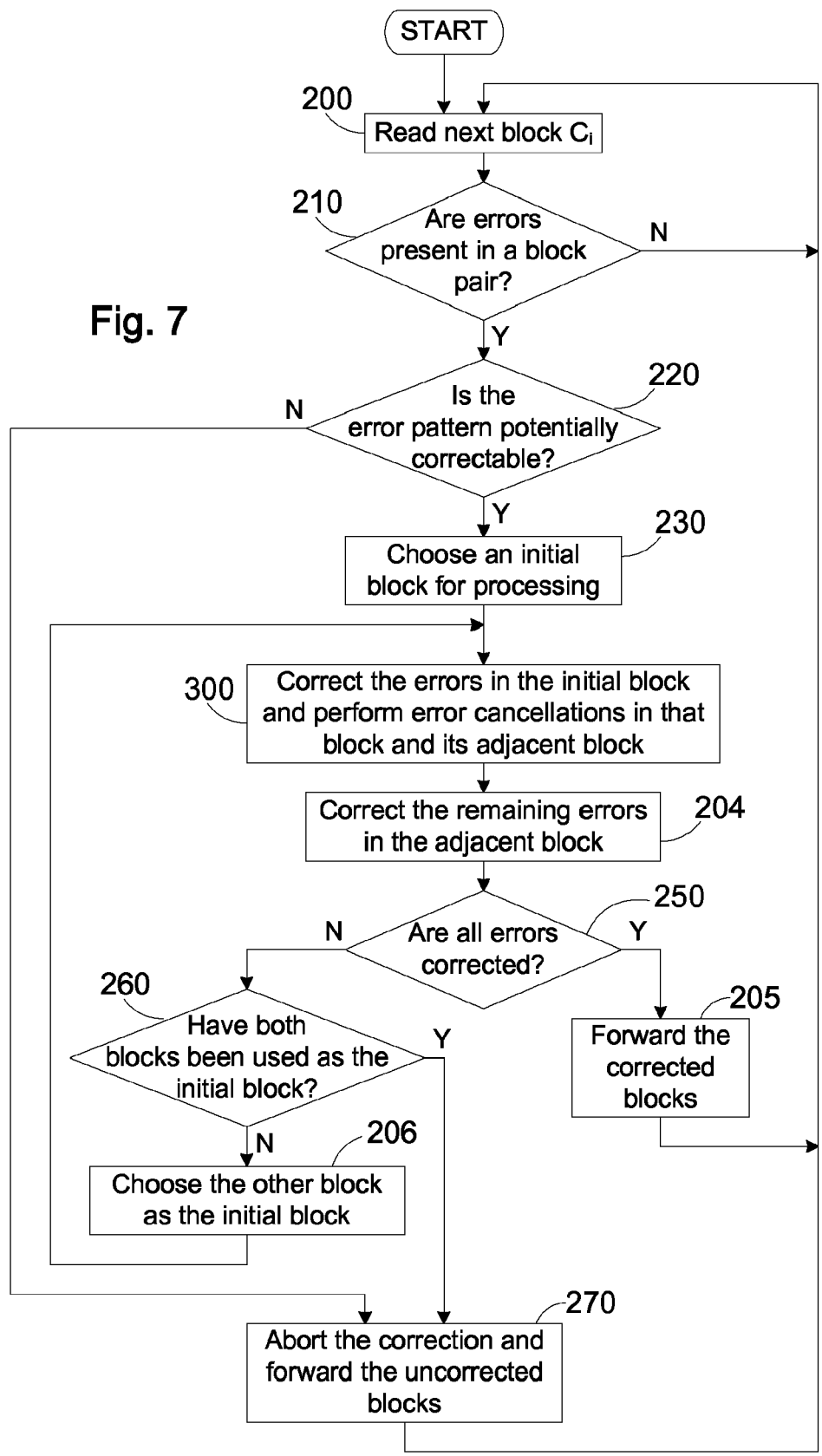
FIG. 7 is a high-level flow diagram that illustrates the error correction technique.

One embodiment of a process is described in connection with FIGS. 7-10. FIG. 7 illustrates the process at a high level. The process can be embodied in various networking equipment, such as an add/drop multiplexer (ADM) for a SONET or SDH network. The data blocks are read repeatedly, e.g., one at a time per processing block 200. After a new data block is read, it is checked to see whether it contains data errors (processing block 210). If the current data block contains errors, it is treated as part of a data block pair if either the immediately previous or immediately following data block also contains errors. If all three consecutive data blocks contain errors, no processing is performed. The next step after identifying an errored pair of adjacent data blocks is to determine whether the error pattern in the data block pair is potentially correctable (decision logic 220). If the errors in the data block pair are potentially correctable, one of the data blocks is chosen as an initial block to begin the correction processing (230). The error correction processing then begins in processing block 300. After error correction is performed based on the errors within the initial data block with an associated canceling of errors in the other data block, an attempt is made to correct the remaining errors in the other data block (processing block 204). For example, the associated cancelling of errors in the other data block by inversion of one or more bits located a particular number of bits away from the corrected error, and correction of the remaining errors, if any, can be performed by decoding of error correction codes. The particular number can be associated with the term(s) of the scrambler polynomial. This number of bits can be adjusted for removal of additional encapsulation, such as encapsulation via transmission through an Ethernet protocol. If the errors in both data blocks can be corrected, the data is forwarded per processing block 205. If errors remain in the data block pair, the other data block is chosen as the initial block and the processing begins again with the original descrambled data for the data block pair. If errors remain after both data blocks have been chosen as the initial block, the errored data blocks are forwarded and flagged as containing errors. Decision logic 250 and 260, and processing block 206 handle the decisions when the other data block should be tried as the initial data block, and state 270 handles the forwarding of the data blocks flagged as errored. The process returns from the state 270 to the state 200.

Figure 8:
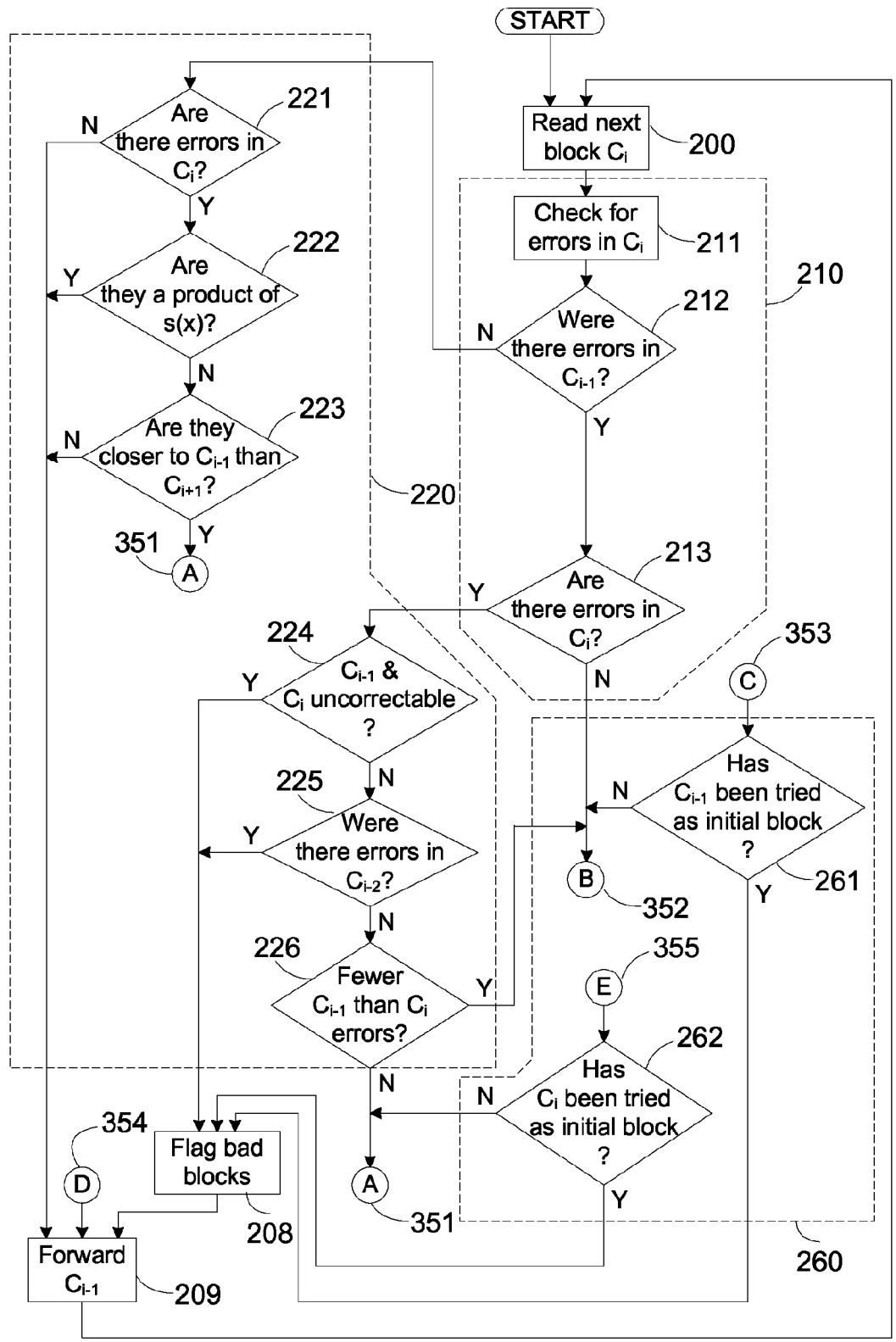
FIG. 8 illustrates the flow diagram of the block reading, selection, and forwarding portions of the error correction technique. This diagram corresponds in essence to blocks 200, 210, 220, and 260 of FIG. 7.

FIG. 8 illustrates a more detailed embodiment of blocks from the FIG. 7. Again, a new data block is read by processing block 200. Processing block 210 checks for errors in the current data block and whether there were errors detected in the immediately previous data block (processing 211, and decision logic 212 and 213). Block 220 (FIG. 7) is implemented here with decision logic 224, 225, and 226 such that no correction is attempted if both data blocks have syndromes for uncorrectable errors or if there have been three consecutive errored blocks. Otherwise the error correction begins by choosing the data block that indicates the fewest errors as the initial data block for processing. If the current data block is selected as the initial data block, output link A 351 takes the processing flow to FIG. 9. If the errors in the data block pair are correctable by the processes of FIG. 9, it returns control to the FIG. 8 processes through input link D 354. Otherwise, it returns from the FIG. 9 processes through input link C 353. If the immediately previous data block is selected as the initial data block, output link B 352 takes the processing flow to FIG. 10. If the errors in the data block pair are correctable by the processes of FIG. 10, it returns control to the FIG. 8 processes through input link D 354. Otherwise, it returns from the FIG. 9 processes through input link E 355. Decision logic 261 and 262 implement the decision block 260 (FIG. 7) regarding whether both data blocks have been tried as an initial data block in the event that correction failed with the first choice of initial data block.

Figure 9:
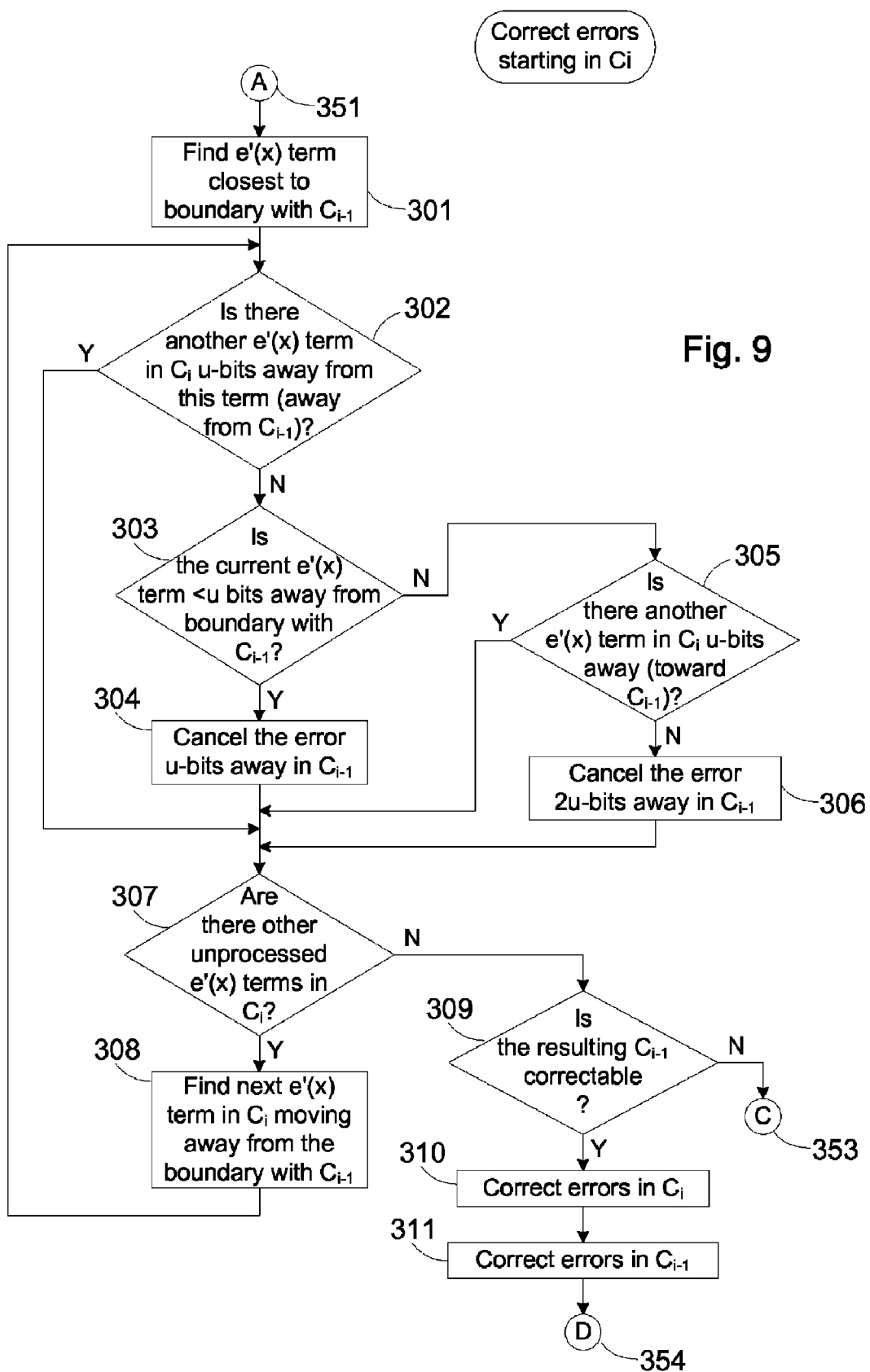
FIG. 9 illustrates the flow diagram of the error correcting technique if the block arriving earlier in time (block C) is chosen as the initial block for processing of the block pair. This diagram corresponds in essence to 300 of FIG. 7.
Figure 10:
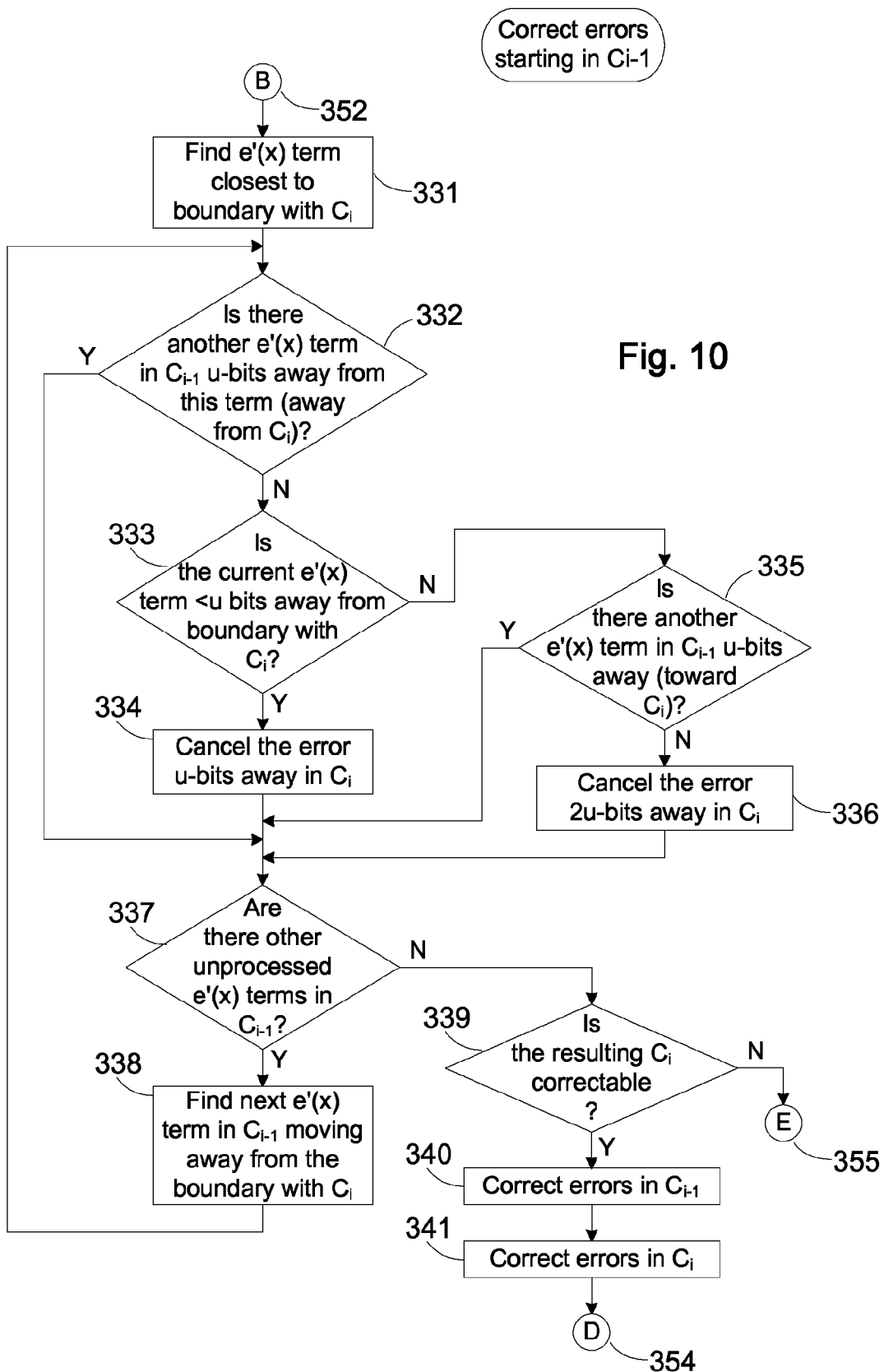
FIG. 10 illustrates the flow diagram of the error correcting technique if the block arriving later in time (block $C_{i+1}$) is chosen as the initial block for processing of the block pair. This diagram corresponds in essence to 300 of FIG. 7.

The error correction processing of block 300 (FIG. 7) is described in greater detail in FIGS. 9 and 10. FIG. 9 shows the processing when the current data block is chosen as the initial data block, and FIG. 10 shows the processing when the immediately previous data block was chosen as the initial data block. The functions of FIGS. 9 and 10 are identical except for the directions in which the errored bits and the associated cancellations are processed. The entrance to the FIG. 9 processes comes through input link A 331 (from FIG. 8), and the entrance to the FIG. 10 processes comes through input link B 332 (from FIG. 8). Processing begins in blocks 301/331 by determining the bit error closest to the boundary between the two data blocks. Decision logic 302/332 determines whether there is another error u-bits away from the block boundary in the current data block. If an error exists here, it corresponds to Case H/I-1 of FIG. 5, and the current error is a replication of an error in that data block. Decision logic 303/333 checks to see whether the current error is less than u-bits away from the boundary. If it is, an error is canceled u-bits away into the adjacent data block (processing block 304/334). This operation corresponds to Cases B and C in FIG. 3 and Cases F and G in FIG. 4. Otherwise, a check is performed by decision logic 305/335 to determine whether there is another errored term u-bits closer to the block boundary. If an errored term exists here, it corresponds to Case H/I-1 in FIG. 5. Otherwise, if no errored term is detected in this location, it corresponds to Case H/I-2 in FIG. 5. In this case, the overlap between the original and multiplied (replicated) error patterns has caused an error cancellation in this term. A corresponding error then exists and will be cancelled 2u-bits away into the other data block (processing block 306/336). Decision logic 307/337 and processing block 308/338 handle stepping through the errored terms that have been detected in the current data block until all have been processed. When all the errored terms in the current data block have been processed, the other data block is checked to determine whether the error pattern remaining in that block is correctable 309/339. If the errors in the other data block are uncorrectable, then the logic of FIG. 8 is invoked via output link C/E 353/355 to try the other data block as the initial block or terminate the correction process. If the errors in the other data block are correctable, the process proceeds to correct the errors in the current block 310/341 and the remaining errors the other data block 311/341, and returns control to the processes of FIG. 8 via output link D 354.

It is possible that an undetectable error pattern exists in the data block containing the most errors of the block pair. In this case, only the data block with the fewest errors would be corrected. The process handles these cases by observing that if the errors are confined to a single data block, the error pattern is a product of $s(x)$. When there are no errors detected in the data blocks adjacent to an errored data block, the process tests to see whether the data block's error pattern is a product of $s(x)$. If it is, then the errors are corrected within that data block. If not, then the process treats the known errored data block as the least errored of a pair. The adjacent data block that is closest to the location of the error burst is then be treated as the other data block of the pair. The decision logic 221, 222, and 223 of FIG. 8 implement the tests associated with this case. It should be noted that when a pattern spans two data blocks, if the error pattern in one is divisible by $s(x)$, the pattern in the other data block should also be divisible by $s(x)$. By judicious choice of $g(x)$ (see, e.g., Criterion 2), it should not be possible to encounter an undetectable error pattern that is a product of $s(x)$.

Alternative embodiment

Figure 11:
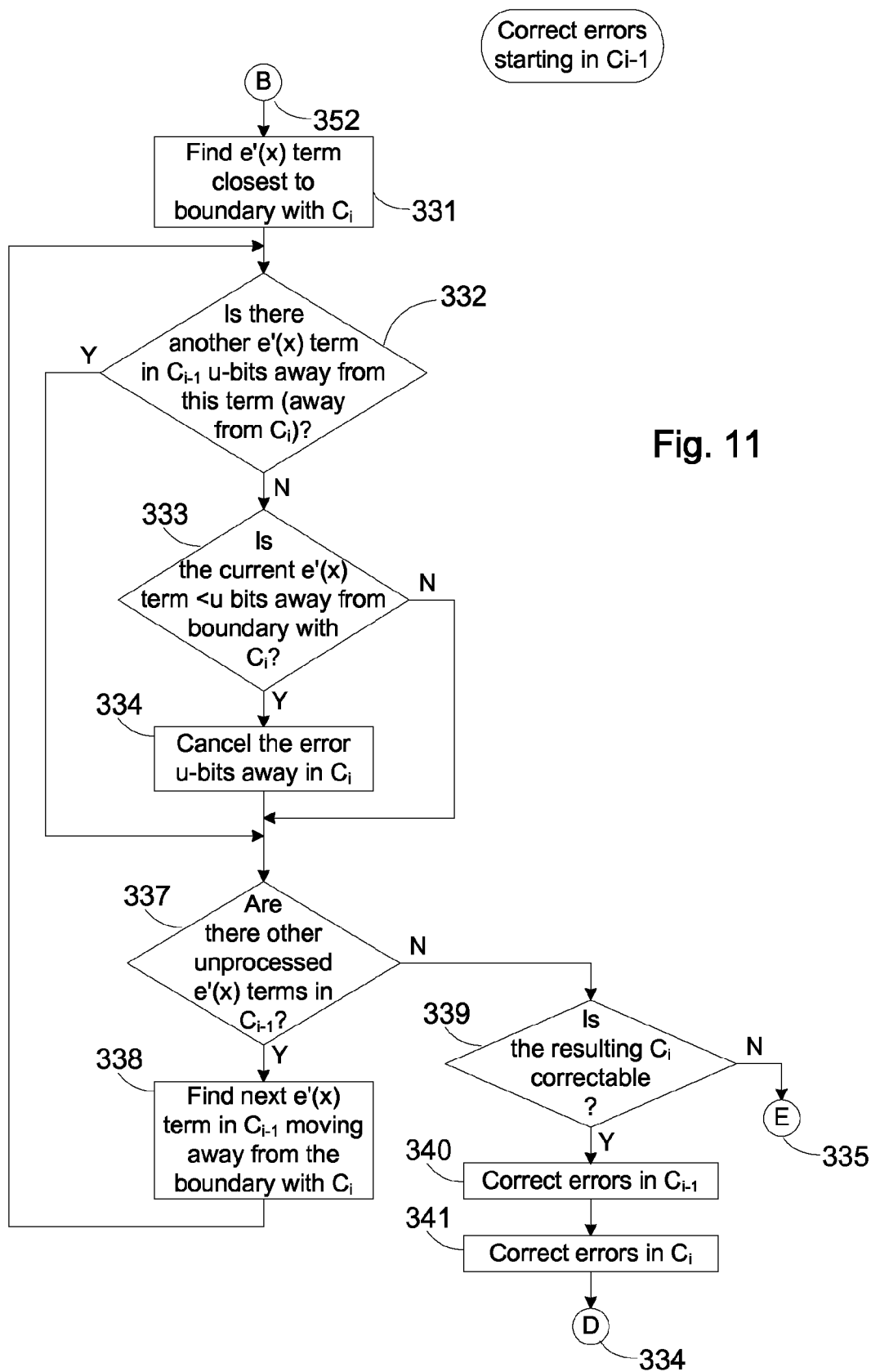
FIG. 11 illustrates a alternative version of the flow diagram in FIG. 10. The simplification of the flow diagram results if the error patterns are restricted to Cases A to D.

If it can assumed that the error burst length is much shorter than the minimum spacing of the scrambler terms (taps), then there will be no overlap between the original and multiplied error patterns. Consequently, cases E-I in FIG. 2B, FIG. 4 and FIG. 6 can be ignored. When these cases can be ignored, the correction technique can be simplified. This simplification is illustrated in FIG. 11, which is a modification to the process of FIG. 10 that shows how the error correction proceeds if data block $C_{i-1}$ is chosen as the initial data block. The process of FIG. 9 can be similarly simplified. Here, decision and processing blocks are the same as in FIG. 10, except that the need for the functions of blocks 335 and 336 in FIG. 10 is eliminated.

Advance Embodiments

Figure 12:
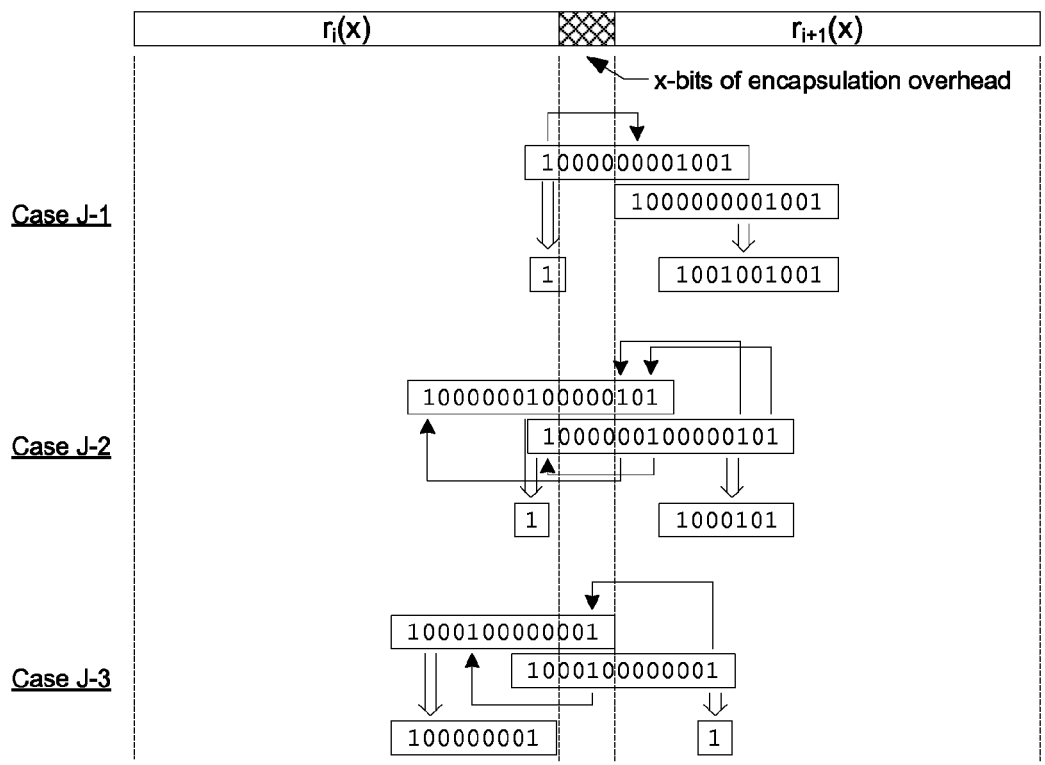
FIG. 12 shows some examples of error patterns for scenarios in which data encapsulation overhead is added between the data blocks prior to transmission and subsequently removed after descrambling, but prior to error correction.

In many telecommunications transport networks, packet data is encapsulated into a server layer data frame. For SONET/SDH, this server layer frame is typically a PoS/HDLC or GFP frame. Also, with GFP and ATM encapsulation there may be an additional Layer 2 encapsulation such as Ethernet. The encapsulation appends additional overhead prior to the self-synchronous scrambler that will typically not be visible to the client data source or sink (receiver). The encapsulation overhead, as illustrated in FIG. 12, appears between the client data blocks. This creates two problems. First, when the encapsulation process overhead is removed, multiplied errors that crossed over into adjacent data blocks are no longer separated by the distance between the descrambler polynomial taps (terms). As a result, to use the method of FIGS. 9 and 10 the client data receiver should account for the error pattern shift caused by the encapsulation overhead removal. The second problem is that even if the client data receiver takes the overhead removal into account, e.g., by inserting dummy bits, it can't know whether any of the multiplied errors were located within the encapsulation overhead. Knowledge of whether there are errors in the encapsulation overhead region is used to determine whether some errors are cancelled 2u bits into the adjacent block.

One method to resolve these issues exploits that the encapsulation overhead also included error detection over its overhead fields. When the encapsulation protocol detects errors in its overhead, it discards the data frame so that the client data receiver does not observe the errors. It is typically assumed that some type of packet/block numbering is used by the data source so that the data receiver can detect the discard of an intermediate packet/block. One extension to the method of FIG. 9 and FIG. 10 then becomes:

1. If an error in the initial data block is $<(u-x)$ bits from the boundary (see FIG. 12, Case J-1), then cancel an error u–x bits into the adjacent data block.
2. If an error in the initial data block is $>u$ bits from the boundary (i.e., the corresponding multiplied error is also in that data block, as illustrated in FIG. 12 Case J-2) then:
    (a) If an error exists u-bits from this error, cancel it as before.
    (b) If no error exists u-bits from this error, then cancel an error 2u–x bits into the adjacent data block.
3. If an error in the initial data block is $>(u-x)$ and $<u$ bits from the boundary i.e., the error corresponds to an error in the encapsulated overhead region, as illustrated in FIG. 12 Case J-3, then cancel an error 2u–x bits into the adjacent data block.

Figure 13:
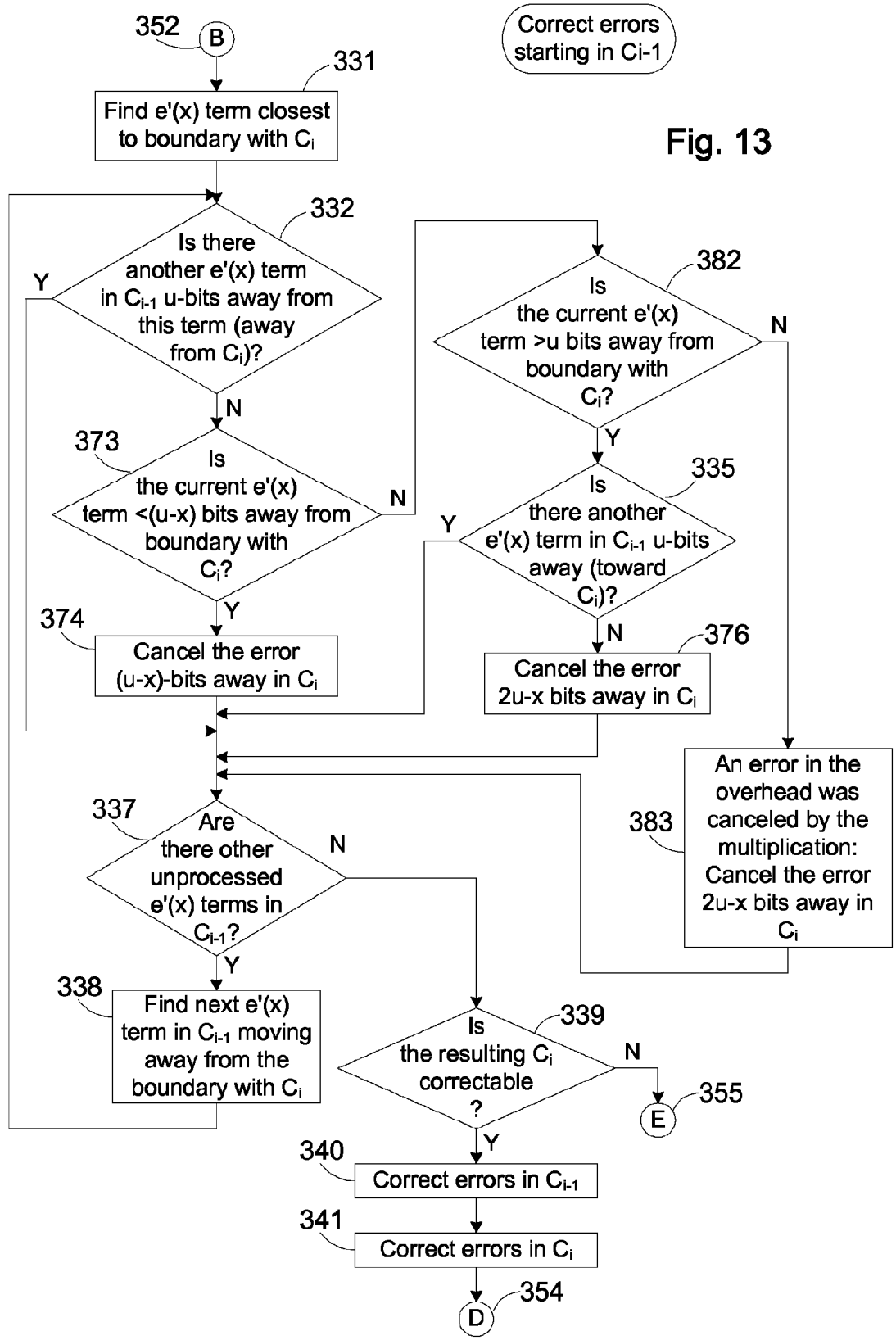
FIG. 13 illustrates an alternative version of the flow diagram in FIG. 10 to handle the new error cases from FIG. 12.

This enhancement to handle encapsulation overhead is illustrated in FIG. 13. This figure is a modification to FIG. 10 that shows how the error correction proceeds if block $C_{i-1}$ is chosen as the initial data block. Here, decision and processing blocks 331, 332, 335, 337, 338, 339, 340, and 341 are the same as in FIG. 10. The decision logic and processing blocks 333, 334, and 336 of FIG. 10 are modified to become 373, 374, and 376, respectively. The modifications to these decision logic and processing blocks take into account the encapsulation overhead's effect on the spacing between errors. Specifically, the removal of the x-bit encapsulation overhead after descrambling causes the distance between the original and multiplied errors to be x-bits closer together when they cross data block boundaries. Cases J-1 and J-2 of FIG. 12 illustrate a scenario wherein no errors affected the encapsulation overhead. The additional decision logic and processing blocks 382 and 383 are added to handle the scenario of Case J-3 in FIG. 12. This case is similar to Case H/I-2 of FIG. 5 except that the overlap between the original error burst and its multiplied replication caused the cancellation of the error(s) in the encapsulation overhead. Consequently, there were no remaining errors in the encapsulation overhead. Decision logic 382 identifies this case, and processing block 383 per-forms the desired cancellation 2u–x-bits away in the adjacent block. FIG. 9 is similarly modified.

One embodiment is a method of correcting errors propagated by a self-synchronous scrambler, wherein the method includes: analyzing a pair of adjacent blocks of data for errors; determining whether or not each block of the pair contains at least one error, and if so: applying error correction via error correction codes to a selected block of the pair; if error in the selected block is correctable by error correction, then using a position of the corrected error in the initially selected block to correct a second one or more replicated errors in the second block of the pair; if error of the initially selected block is not correctable by error correction, then: applying error correction via error correction codes to the second block of the pair; and if error of the second block is correctable by error correction, then using a position of the corrected error to correct one or more replicated errors in the initially selected block.

One embodiment is an apparatus for correcting errors propagated by a self-synchronous scrambler, wherein the apparatus includes: an error correction decoder; and a circuit configured to analyze a pair of adjacent blocks of data for errors and to determine whether or not each block of the pair contains at least one error, and if so: the circuit is configured to activate the error correction decoder to decode error correction codes for a selected block of the pair; the circuit is configured to determine if error in the selected block is correctable by error correction, and if true then the circuit is configured to correct a second one or more replicated errors in the second block of the pair based on a position of the corrected error in the initially selected block; the circuit is configured to determine if error of the initially selected block is not correctable by error correction, and if so: the circuit is configured to activate the error correction decoder to decode error correction codes for the second block of the pair; and the circuit is configured to determine if error of the second block is correctable by error correction, and if true, then the circuit is configured to correct error one or more replicated errors in the initially selected block based on a position of the corrected error of the second block.

One embodiment includes a method of providing forward error correction for data to be scrambled by a self-synchronous scrambler for a transmission channel, wherein the method includes: encoding the data using a Hamming distance dmin greater than or equal to $\{1+(t)[1+wt(s(x))]\}$, but less than $\{1+(2t)[wt(s(x))]\}$, wherein t corresponds to a specified maximum number of errors permitted for the transmission channel per block, and wherein $wt(s(x))$ is a weight of a polynomial $s(x)$ that characterizes operation of the self-synchronous scrambler; and scrambling the encoded data with the self-synchronous scrambler.

Various embodiments have been described above. Although described with reference to these specific embodiments, the descriptions are intended to be illustrative and are not intended to be limiting. Various modifications and applications may occur to those skilled in the art.

What is claimed is:

1. A method of providing forward error correction for data to be scrambled by a self-synchronous scrambler for a transmission channel, the method comprising:
   encoding the data using a Hamming distance $d_{min}$ greater than or equal to $\{1+(t)[1+wt(s(x))]\}$, but less than $\{1+(2t)[wt(s(x))]\}$, wherein t corresponds to a specified maximum number of errors permitted for the transmission channel per block, and wherein $wt(s(x))$ is a weight of a polynomial $s(x)$ that characterizes operation of the self-synchronous scrambler, wherein encoding is performed by electronic hardware; and
   scrambling the encoded data with the self-synchronous scrambler.

2. The method of claim 1, wherein encoding is performed at a Hamming distance $d_{min}$ of $\{1+(t)[1+wt(s(x))]\}$.

3. The method of claim 1, wherein the method is embodied in an add/drop multiplexer.

4. An apparatus for encoding data for a transmission channel, the apparatus comprising:
   forward error correction hardware configured to encode the data using a Hamming distance $d_{min}$ greater than or equal to $\{1+(t)[1+wt(s(x))]\}$, but less than $\{1+(2t)[wt(s(x))]\}$, wherein t corresponds to a specified maximum number of errors permitted for the transmission channel per block; and
   a self-synchronous scrambler configured to scramble the encoded data, wherein $wt(s(x))$ is a weight of a polynomial $s(x)$ that characterizes operation of the self-synchronous scrambler.

5. The apparatus of claim 4, wherein the forward error correction hardware is configured to perform encoding at a Hamming distance $d_{min}$ of $\{1+(t)[1+wt(s(x))]\}$.

6. The apparatus of claim 4, wherein the apparatus further comprises an add/drop multiplexer.

7. An apparatus for encoding data for a transmission channel, the apparatus comprising:
   means for encoding the data using a Hamming distance $d_{min}$ greater than or equal to $\{1+(t)[1+wt(s(x))]\}$, but less than $\{1+(2t)[wt(s(x))]\}$, wherein t corresponds to a specified maximum number of errors permitted for the transmission channel per block; and
   a self-synchronous scrambler configured to scramble the encoded data, wherein $wt(s(x))$ is a weight of a polynomial $s(x)$ that characterizes operation of the self-synchronous scrambler.

8. The apparatus of claim 7, wherein the encoding means is configured to perform encoding at a Hamming distance $d_{min}$ of $\{1+(t)[1+wt(s(x))]\}$.

9. The apparatus of claim 7, wherein the apparatus further comprises an add/drop multiplexer.

* * * * *